US011860428B1

(12) United States Patent
Lau et al.

(10) Patent No.: US 11,860,428 B1
(45) Date of Patent: Jan. 2, 2024

(54) PACKAGE STRUCTURE AND OPTICAL SIGNAL TRANSMITTER

(71) Applicant: Unimicron Technology Corp., Taoyuan (TW)

(72) Inventors: John Hon-Shing Lau, Taoyuan (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 1 day.

(21) Appl. No.: 17/835,990

(22) Filed: Jun. 9, 2022

(51) Int. Cl.
*G02B 6/42* (2006.01)
*H01S 5/42* (2006.01)

(52) U.S. Cl.
CPC ......... *G02B 6/4274* (2013.01); *G02B 6/4249* (2013.01); *G02B 6/4271* (2013.01); *G02B 6/4295* (2013.01); *H01S 5/423* (2013.01)

(58) Field of Classification Search
None
See application file for complete search history.

(56) References Cited

U.S. PATENT DOCUMENTS

| 2003/0031435 | A1* | 2/2003 | Yeh | G02B 6/4249 385/88 |
| 2003/0186476 | A1* | 10/2003 | Naydenkov | G02B 6/12007 438/26 |
| 2005/0089264 | A1* | 4/2005 | Johnson | G02B 6/1221 385/52 |
| 2006/0013525 | A1* | 1/2006 | Murayama | H01S 5/02325 385/14 |

FOREIGN PATENT DOCUMENTS

TW 201841392 11/2018

OTHER PUBLICATIONS

John H. Lau, "Recent Advances and Trends in Advanced Packaging", IEEE Transactions On Components, Packaging and Manufacturing Technology, Feb. 2022, pp. 1-25.
Lim Teck Guan et al., "FOWLP and Si-Interposer for High-Speed Photonic Packaging", 2021 IEEE 71st Electronic Components and Technology Conference, Jun. 2021, pp. 250-255.
"Office Action of Taiwan Counterpart Application", dated Apr. 14, 2023, p. 1-p. 5.

* cited by examiner

*Primary Examiner* — Jerry Rahll
(74) *Attorney, Agent, or Firm* — JCIPRNET

(57) ABSTRACT

A package structure includes a circuit board, a package substrate, a fine metal L/S RDL-substrate, an electronic assembly, a photonic assembly, a heat dissipation assembly, and an optical fiber assembly. The package substrate is disposed on and electrically connected to the circuit board. The fine metal L/S RDL-substrate is disposed on and electrically connected to the package substrate. The electronic assembly includes an application specific integrated circuit (ASIC) assembly, an electronic integrated circuit (EIC) assembly, and a photonic integrated circuit (PIC) assembly which are respectively disposed on the fine metal L/S RDL-substrate and electrically connected to the package substrate by the fine metal L/S RDL-substrate. The heat dissipation assembly is disposed on the electronic assembly. The optical fiber assembly is disposed on the package substrate and electrically connected to the package substrate and the PIC assembly. A packaging method of the VCSEL array chip is presented.

9 Claims, 5 Drawing Sheets

10a

PACKAGE STRUCTURE AND OPTICAL SIGNAL TRANSMITTER

BACKGROUND

Technical Field

The disclosure relates to a semiconductor structure; more particularly, the disclosure relates to a package structure and an optical signal transmitter.

Description of Related Art

In recent years, high-performance computing (HPC) has become more and more popular and extensively applied in advanced networking and server applications, especially for artificial intelligence (AI) related products requiring high data transmission speed, increasing bandwidth, and gradually reduced latency. People have more and more expectations and requirements for high-density (HD) package carriers adopted in HPC package structures, such as requirements for the reduced line width and line spacing of metal layers and for the reduced thickness of a dielectric layer of a redistribution circuit layer. Usually, this is achieved by adding a through-silicon via (TSV) interposer on top of a build-up package substrate. However, the TSV interposer is rather costly.

SUMMARY

The disclosure provides a package structure which may resolve conventional issues and is cost effective.

The disclosure further provides an optical signal transmitter with favorable optical efficiency.

In an embodiment of the disclosure, a package structure including a circuit board, a package substrate, a fine metal linewidth and spacing redistribution layer (L/S RDL)-substrate (structure), an electronic assembly, a heat dissipation assembly, and an optical fiber assembly is provided. The package substrate is disposed on and electrically connected to the circuit board. The fine metal L/S RDL-substrate is disposed on and electrically connected to the package substrate. The electronic assembly includes an application specific integrated circuit (ASIC) assembly, an electronic integrated circuit (EIC) assembly, and a photonic integrated circuit (PIC) assembly which are respectively disposed on the fine metal L/S RDL-substrate and electrically connected to the package substrate by the fine metal L/S RDL-substrate. The PIC assembly includes an optical signal transmitter, and the optical signal transmitter includes a base, a plurality of vertical cavity surface emitting laser (VCSEL) sources, and a plurality of solder bumps. The base includes a plurality of pads. The VCSEL sources are arranged in an array on the base. The solder bumps are disposed between the base and the VCSEL sources. Here, the VCSEL sources are electrically connected to the pads of the base by the solder bumps. The heat dissipation assembly is disposed on the electronic assembly. The optical fiber assembly is disposed on the package substrate and electrically connected to the package substrate and the PIC assembly.

According to an embodiment of the disclosure, the package structure further includes a plurality of first solder balls, a plurality of second solder balls, and a plurality of third solder balls. The first solder balls are disposed between the package substrate and the circuit board, and the package substrate is electrically connected to the circuit board by the first solder balls. The second solder balls are disposed between the fine metal L/S RDL-substrate and the package substrate, and the fine metal L/S RDL-substrate is electrically connected to the package substrate by the second solder balls. The third solder balls are disposed between the electronic assembly and the fine metal L/S RDL-substrate, and the electronic assembly is electrically connected to the fine metal L/S RDL-substrate by the third solder balls. A dimension of each of the third solder balls is smaller than a dimension of each of the second solder balls, and the dimension of each of the second solder balls is smaller than a dimension of each of the first solder balls.

According to an embodiment of the disclosure, the package structure further includes an underfill that is disposed between the electronic assembly and the fine metal L/S RDL-substrate and encapsulates the third solder balls.

According to an embodiment of the disclosure, the heat dissipation assembly includes a first heat dissipator, a second heat dissipator, and a thermoelectric cooler. The first heat dissipator is disposed on the ASIC assembly. The second heat dissipator is disposed on the EIC assembly. The thermoelectric cooler is disposed on the first heat dissipator and the second heat dissipator, the first heat dissipator is located between the thermoelectric cooler and the ASIC assembly, and the second heat dissipator is located between the thermoelectric cooler and the EIC assembly.

According to an embodiment of the disclosure, the heat dissipation assembly includes a plurality of thermoelectric coolers and a plurality of heat dissipators. The thermoelectric coolers are respectively disposed on the ASIC assembly, the EIC assembly, and the PIC assembly. The heat dissipators are respectively disposed on the thermoelectric coolers. Here, the thermoelectric coolers are located between the heat dissipators and the ASIC assembly, the EIC assembly, and the PIC assembly, respectively.

According to an embodiment of the disclosure, the heat dissipation assembly further includes a plurality of first thermal interface materials and a plurality of second thermal interface materials. The first thermal interface materials are respectively disposed between the thermoelectric coolers and the ASIC assembly, the EIC assembly, and the PIC assembly. The second thermal interface materials are respectively disposed between the heat dissipators and the thermoelectric coolers.

According to an embodiment of the disclosure, the PIC assembly further includes a photodiode (PD), and the EIC assembly includes a transimpedance amplifier and a driver chip.

According to an embodiment of the disclosure, the optical fiber assembly includes an optical fiber connector, a first fiber coupler, a second fiber coupler, a first optical fiber cable, and a second optical fiber cable. The optical fiber connector is disposed on the package substrate, the first optical fiber cable passes through the optical fiber connector and is connected to the PD by the first fiber coupler, and the second optical fiber cable passes through the optical fiber connector and is connected to the optical signal transmitter by the second fiber coupler.

According to an embodiment of the disclosure, an optical signal enters the photodiode (PD) and transimpedance amplifier (TIA) from the first optical fiber cable, the PD converts the optical signal into an electric signal, amplifies the electric signal by the TIA, and transmits the amplified electric signal to the ASIC assembly. The ASIC assembly transmits the electric signal to the optical signal transmitter by the driver chip to convert the electric signal into another optical signal and emits the optical signal outward to the second optical fiber cable to transmit the optical signal to an external circuit.

In an embodiment of the disclosure, an optical signal transmitter including a base, a plurality of VCSEL sources, and a plurality of solder bumps is provided. The base includes a plurality of pads. The VCSEL sources are arranged in an array on the base. The solder bumps are disposed between the base and the VCSEL sources. Here, the VCSEL sources are electrically connected to the pads of the base by the solder bumps.

In view of the above, in the design of the package structure provided in one or more embodiments of the disclosure, the ASIC assembly, the EIC assembly, and the PIC assembly of the electronic assembly are respectively disposed on the fine metal L/S RDL-substrate and electrically connected to the package substrate by the fine metal L/S RDL-substrate. Compared to the conventional package structure utilizing the TSV interposer in the related art, the package structure provided herein not only meets the expectations and requirements for the HD package structure but also saves the costs.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
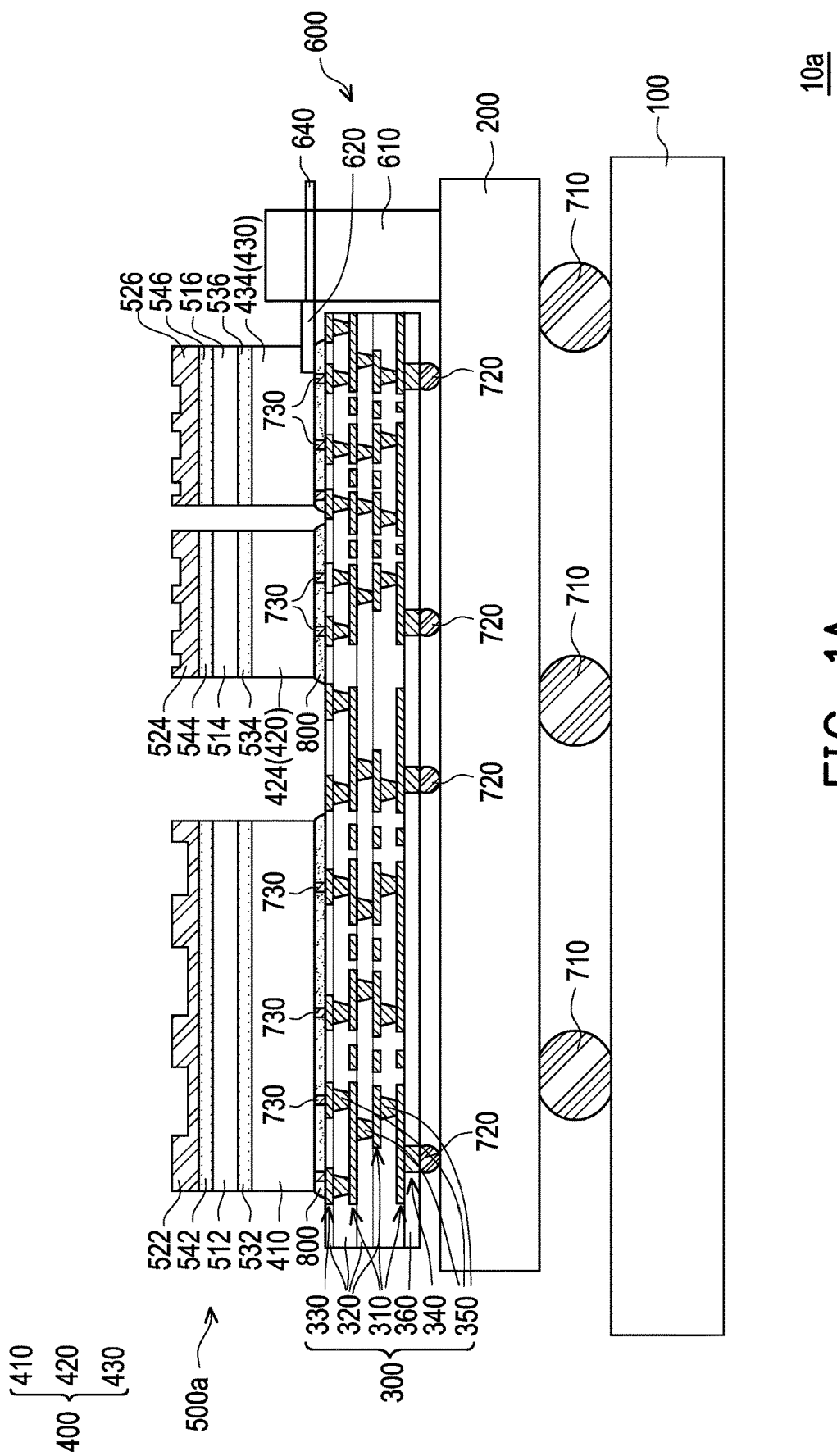
FIG. 1A is a schematic cross-sectional view illustrating a package structure according to an embodiment of the disclosure.
Figure 1B:
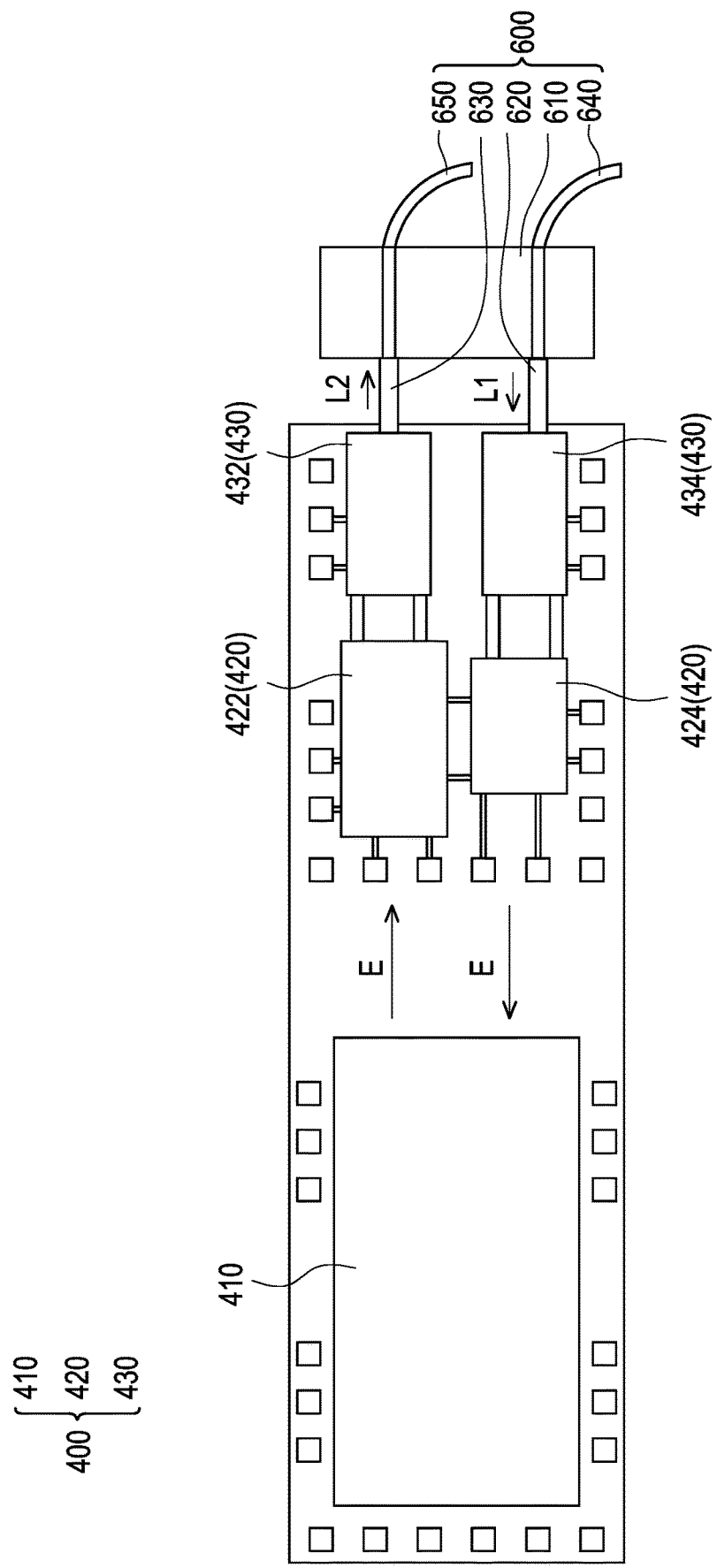
FIG. 1B is a schematic top view illustrating the package structure depicted in FIG. 1A.
Figure 1C:
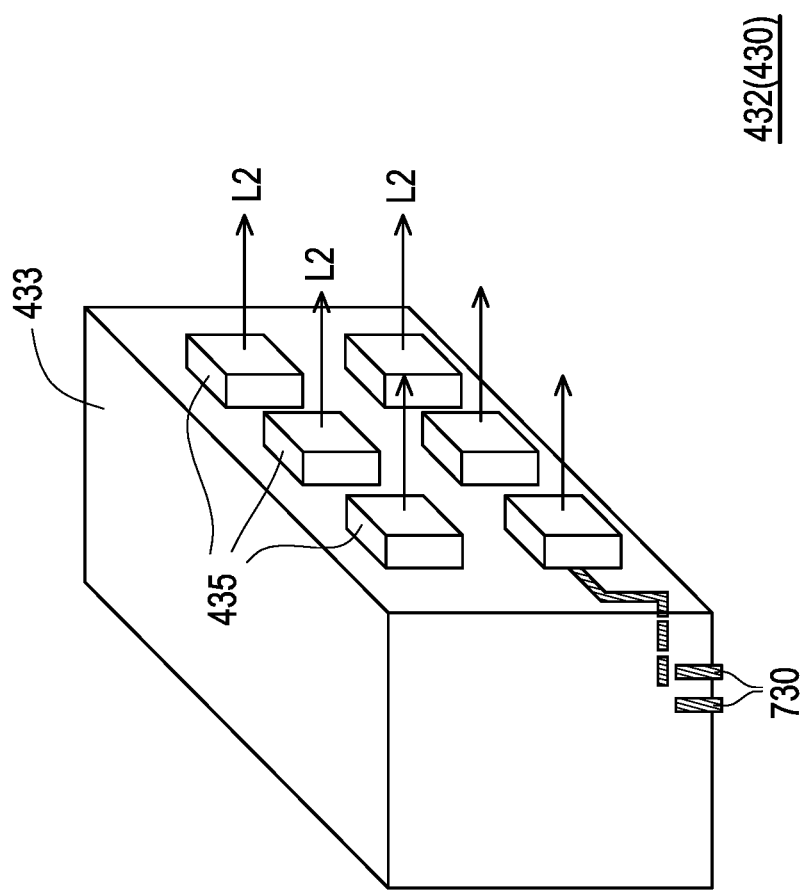
FIG. 1C is a schematic three-dimensional view illustrating an optical signal transmitter in the package structure depicted in FIG. 1A.
Figure 1D:
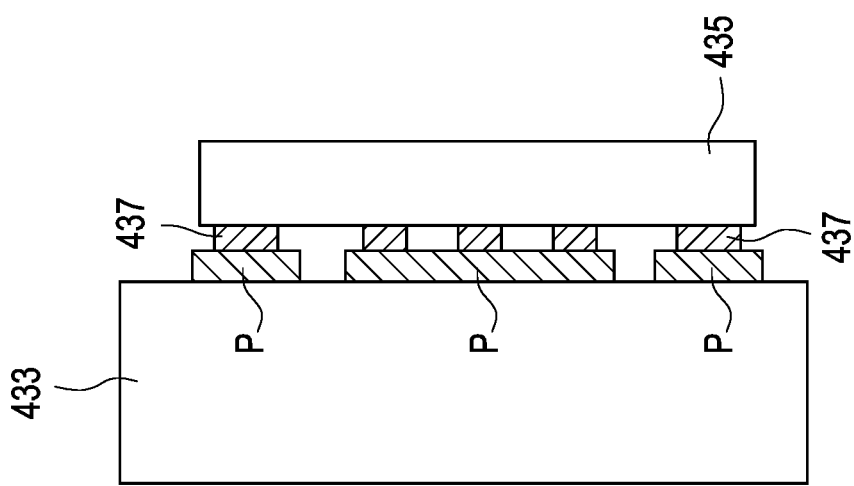
FIG. 1D is a schematic side view illustrating a portion of the optical signal transmitter depicted in FIG. 1C.

FIG. 1A is a schematic cross-sectional view illustrating a package structure according to an embodiment of the disclosure. FIG. 1B is a schematic top view illustrating the package structure depicted in FIG. 1A. FIG. 1C is a schematic three-dimensional view illustrating an optical signal transmitter in the package structure depicted in FIG. 1A. FIG. 1D is a schematic side view illustrating a portion of the optical signal transmitter depicted in FIG. 1C. For the convenience of explanation, some components, such as a heat dissipation assembly 500, are omitted from FIG. 1B.

With reference to FIG. 1A and FIG. 1B, in this embodiment, a package structure includes a circuit board 100, a package substrate 200, a fine metal L/S RDL-substrate 300, an electronic assembly 400, a heat dissipation assembly 500a, and an optical fiber assembly 600. The package substrate 200 is disposed on the circuit board 100 and electrically connected to the circuit board 100. The fine metal L/S RDL-substrate 300 is disposed on the package substrate 200 and electrically connected to the package substrate 200, and the package substrate 200 is located between the fine metal L/S RDL-substrate 300 and the circuit board 100. The electronic assembly 400 includes an ASIC assembly 410, an EIC assembly 420, and a PIC assembly 430, and the fine metal L/S RDL-substrate 300 is located between the electronic assembly 400 and the package substrate 200. The ASIC assembly 410, the EIC assembly 420, and the PIC assembly 430 are respectively disposed on the fine metal L/S RDL-substrate 300 and electrically connected to the package substrate 200 by the fine metal L/S RDL-substrate 300. The heat dissipation assembly 500a is disposed on the electronic assembly 400 to dissipate heat from the electronic assembly 400. The optical fiber assembly 600 is disposed on the package substrate 200 and optically connected to the PIC assembly 430.

That is, the ASIC assembly 410, the EIC assembly 420, and the PIC assembly 430 provided in the embodiment are respectively disposed on the fine metal L/S RDL-substrate 300 and electrically connected to the package substrate 200 by the fine metal L/S RDL-substrate 300. Compared to the conventional package structure utilizing the TSV interposer in the related art, the package structure 10a provided in the embodiment not only meets the expectations and requirements for the HD package structure but also save costs because the costs of the fine metal L/S RDL-substrate 300 are lower than those of the TSV interposer in the related art.

With reference to FIG. 1A, in this embodiment, the fine metal L/S RDL-substrate 300 includes a plurality of patterned circuit layers 310, a plurality of dielectric layers 320, a plurality of first pads 330, a plurality of second pads 340, a plurality of conductive blind vias 350, and a solder mask layer 360. The patterned circuit layers 310 and the dielectric layers 320 are alternately stacked, wherein a line width and a line spacing of the patterned circuit layers 310 are, for instance, 2 micrometer (μm), 5 μm, and 10 μm, which indicates that the patterned circuit layers 310 are fine circuit layer. In principle, the layout density of the fine metal L/S RDL-substrate 300 is greater than the layout density of the package substrate 200, and the layout density of the package substrate 200 is greater than the layout density of the circuit board 100. A material of the dielectric layers 320 is, for instance, a photosensitive dielectric material or an Ajinomoto build-up film (ABF) of which a thickness is less than or equal to 5 μm, which should however not be construed as a limitation in the disclosure. Surfaces of the first pads 330 are exposed and aligned to a surface of one of the dielectric layers 320 closest to the electronic assembly 400. The second pads 340 are directly electrically connected to the patterned circuit layers 310, wherein surfaces of the second pads 340 are exposed and aligned to a surface of the solder mask layer 360. The conductive blind vias 350 pass through the dielectric layers 320 and are electrically connected among the patterned circuit layers 310, electrically connected between the patterned circuit layers 310 and the first pads 330, and electrically connected to the patterned circuit layers 310.

Besides, as shown in FIG. 1A, the heat dissipation assembly 500a provided in this embodiment includes a plurality of thermoelectric coolers 512, 514, and 516 and a plurality of heat dissipators 522, 524, and 526. The thermoelectric cooler 512 is disposed on the ASIC assembly 410, the thermoelectric cooler 514 is disposed on the EIC assembly 420, and the thermoelectric cooler 516 is disposed on the PIC assembly 430. The heat dissipator 522 is disposed on the thermoelectric cooler 512, wherein the thermoelectric cooler 512 is located between the heat dissipator 522 and the ASIC assembly 410. The heat dissipator 524 is disposed on the thermoelectric cooler 514, wherein the thermoelectric cooler 514 is located between the heat dissipator 524 and the EIC assembly 420. The heat dissipator 526 is disposed on the thermoelectric cooler 516, wherein the thermoelectric cooler 516 is located between the heat dissipator 526 and the PIC assembly 430. Here, thicknesses of the thermoelectric coolers 512, 514, and 516 may be the same or different, and thicknesses of the thermoelectric coolers 512, 514, and 516 may be adjusted according to actual requirements, which should not be construed as a limitation in the disclosure.

In particular, the heat dissipation assembly 500a provided in this embodiment further includes a plurality of first thermal interface materials 532, 534, and 536 and a plurality of second thermal interface materials 542, 544, and 546, whereby the thermoelectric coolers 512, 514, and 516 and the heat dissipators 522, 524, and 526 are fixed to the electronic assembly 400. Specifically, the first thermal interface material 532 is disposed between the thermoelectric cooler 512 and the ASIC assembly 410, and the second thermal interface material 542 is disposed between the heat dissipator 522 and the thermoelectric cooler 512. The first thermal interface material 534 is disposed between the thermoelectric cooler 514 and the EIC assembly 420, and the second thermal interface material 544 is disposed between the heat dissipator 524 and the thermoelectric cooler 514. The first thermal interface material 536 is disposed between the thermoelectric cooler 516 and the PIC assembly 430, and the second thermal interface material 546 is disposed between the heat dissipator 526 and the thermoelectric cooler 516.

Moreover, as shown in FIG. 1A, the package structure 10a provided in this embodiment further includes a plurality of first solder balls 710, a plurality of second solder balls 720, and a plurality of third solder balls 730. The first solder balls 710 (ball grid array solder balls) are disposed between the package substrate 200 and the circuit board 100, wherein the package substrate 200 is electrically connected to the circuit board 100 by the first solder balls 710. The second solder balls 720 (controlled collapse chip connection or C4 solder bumps) are disposed between the fine metal L/S RDL-substrate 300 and the package substrate 200, wherein the fine metal L/S RDL-substrate 300 is electrically connected to the package substrate 200 by the second solder balls 720. The third solder balls 730 (micro-bumps or Cu-pillar+solder cap) are disposed between the electronic assembly 400 and the fine metal L/S RDL-substrate 300, wherein the electronic assembly 400 is electrically connected to the fine metal L/S RDL-substrate 300 by the third solder balls 730. Here, a dimension of each of the third solder balls 730 is smaller than a dimension of each of the second solder balls 720, and the dimension of each of the second solder balls 720 is smaller than a dimension of each of the first solder balls 710. That is, the first solder balls 710 have the largest dimension, and the third solder balls 730 have the smallest dimension; here, the dimension of the third solder balls 730 is, for instance, in the micrometer scale. In addition, the package structure 10a provided in the embodiment further includes an underfill 800 that is disposed between the electronic assembly 400 and the fine metal L/S RDL-substrate 300 and encapsulates the third solder balls 730, whereby the third solder balls 730 are encapsulated.

With reference to FIG. 1A and FIG. 1B, in this embodiment, the EIC assembly 420 includes a driver chip 422 and a transimpedance amplifier (TIA) 424. The PIC assembly 430 includes a photodiode (PD) 434 in addition to the optical signal transmitter 432. The optical fiber assembly 600 includes an optical fiber connector 610, a first fiber coupler 620, a second fiber coupler 630, a first optical fiber cable 640, and a second optical fiber cable 650. The optical fiber connector 610 is disposed on the package substrate 200. The first optical fiber cable 640 passes through the optical fiber connector 610 and is optically connected to the PD 434 by the first fiber coupler 620. The second optical fiber cable 650 passes through the optical fiber connector 610 and is optically connected to the optical signal transmitter 432 by the second fiber coupler 630. That is, in the package structure 10a provided in this embodiment, optical and electrical components (i.e., the PIC assembly 430 and the EIC assembly 420) are heterogeneously integrated onto the fine metal L/S RDL-substrate 300 at the same time, and signals are transmitted through the optical fiber assembly 600 and the fine metal L/S RDL-substrate 300.

In detail, as shown in FIG. 1B, an optical signal L1 enters the PD 434 and TIA 424 from the first optical fiber cable 640. The PD 434 and TIA 424 convert weak optical signals into electrical signals and amplify the signal with a certain intensity and low noise.

The amplified electric signal (E) is then transmitted to the ASIC assembly 410 through the fine metal L/S RDL-substrate 300. After operations, the ASIC assembly 410 then transmits the electric signal E to the laser driver 422 and the optical signal transmitter 432 through the fine metal L/S RDL-substrate 300, so the electric signal E can be converted into another optical signal L2, and the optical signal L2 is emitted to the second optical fiber cable 650. More specifically, with reference to FIG. 1C and FIG. 1D, the optical signal transmitter 432 provided in this embodiment includes a base 433, a plurality of vertical cavity surface emitting laser (VCSEL) sources 435, and a plurality of solder bumps 437. The base 433 includes a plurality of pads P. VCSEL sources 435 are arranged on base 433 in an array. The solder bumps 437 are disposed between the base 433 and the VCSEL sources 435, wherein the VCSEL sources 435 are electrically connected to the pads P of the base 433 by the solder bumps 437. Here, the optical signal transmitter 432 is embodied as the VCSEL.

With reference to FIG. 1A, in a process of manufacturing the package structure the fine metal L/S RDL-substrate 300 is provided first. Next, the electronic assembly 400 is bonded to the fine metal L/S RDL-substrate 300 by the third solder balls 730, and the underfill 800 is filled between the electronic assembly 400 and the fine metal L/S RDL-substrate 300 to encapsulate the third solder balls 730. Next, the second solder balls 720 are formed on one side of the fine metal L/S RDL-substrate 300 relatively far away from the electronic assembly 400. After that, said structure is cut in a singulation process to form one single structure and is then bonded to the package substrate 200 by the second solder balls 720 and assembled to the circuit board 100 by the first solder balls 710 formed on the package substrate 200. Finally, after the heat dissipation assembly 500a is formed on the electronic assembly 400, the fabrication of the package structure 10a is completed.

Note that the reference numbers and some descriptions provided in the previous embodiments are also applied in the following embodiment, the same reference numbers serve to represent the same or similar devices, and the descriptions of the same technical content are omitted. The description of the omitted content may be found in the previous embodiments and will not be repeated in the following embodiment.

Figure 2:
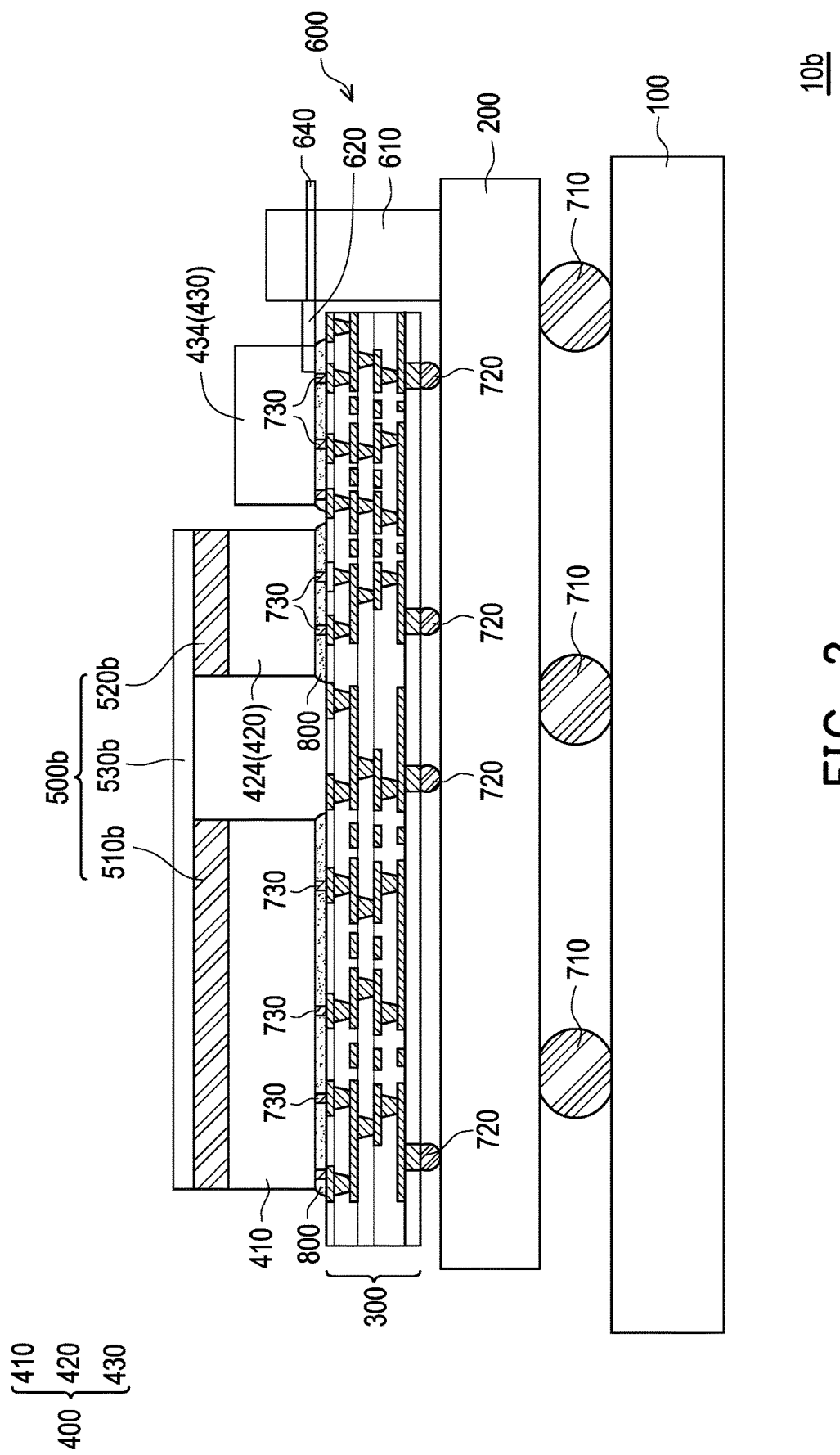
FIG. 2 is a schematic cross-sectional view illustrating a package structure according to another embodiment of the disclosure.

FIG. 2 is a schematic cross-sectional view illustrating a package structure according to another embodiment of the disclosure. With reference to FIG. 1A and FIG. 2, a package structure 10b provided in this embodiment is similar to the package structure 10a depicted in FIG. 1A, while the difference between the two lies in that a heat dissipation assembly 500b of the package structure 10b provided in this embodiment is different from the heat dissipation assembly 500a of the package structure 10a depicted in FIG. 1A. In detail, in this embodiment, the heat dissipation assembly 500b includes thermal interface materials 510b and 520b and a heat dissipator 530b. The heat dissipator 530b is disposed on the ASIC assembly 410 and the EIC assembly 420. The interface material 510b is located between the heat dissipator 530b and the ASIC assembly 410, and the interface material 520b is located between the heat dissipator 530b and the EIC assembly 420.

To sum up, in the design of the package structure provided in one or more embodiments of the disclosure, the ASIC assembly, the EIC assembly, and the PIC assembly of the electronic assembly are respectively disposed on the fine metal L/S RDL-substrate and electrically connected to the package substrate by the fine metal L/S RDL-substrate. Compared to the conventional package structure utilizing the TSV interposer in the related art, the package structure provided herein not only meets the expectations and requirements for the HD package structure but also save the costs.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A package structure, comprising:
   a circuit board;
   a package substrate, disposed on and electrically connected to the circuit board;
   a fine metal L/S RDL-substrate, disposed on and electrically connected to the package substrate;
   an electronic assembly, comprising an application specific integrated circuit assembly, an electronic integrated circuit assembly, and a photonic integrated circuit assembly respectively disposed on the fine metal L/S RDL-substrate and electrically connected to the package substrate by the fine metal L/S RDL-substrate, wherein the photonic integrated circuit assembly comprises an optical signal transmitter, and the optical signal transmitter comprises:
      a base, comprising a plurality of pads;
      a plurality of vertical cavity surface emitting laser sources, arranged in an array on the base; and
      a plurality of solder bumps, disposed between the base and the vertical cavity surface emitting laser sources, wherein the vertical cavity surface emitting laser sources are electrically connected to the pads of the base by the solder bumps;
   a heat dissipation assembly, disposed on the electronic assembly; and
   an optical fiber assembly, disposed on the package substrate and electrically connected to the package substrate and optically connected to the photonic integrated circuit assembly.

2. The package structure according to claim 1, further comprising:
   a plurality of first solder balls, disposed between the package substrate and the circuit board, wherein the package substrate is electrically connected to the circuit board by the first solder balls;
   a plurality of second solder balls, disposed between the fine metal L/S RDL-substrate and the package substrate, wherein the fine metal L/S RDL-substrate is electrically connected to the package substrate by the second solder balls; and
   a plurality of third solder balls, disposed between the electronic assembly and the fine metal L/S RDL-substrate, wherein the electronic assembly is electrically connected to the fine metal L/S RDL-substrate by the third solder balls, a dimension of each of the third solder balls is smaller than a dimension of each of the second solder balls, and the dimension of each of the second solder balls is smaller than a dimension of each of the first solder balls.

3. The package structure according to claim 2, further comprising:
   an underfill, disposed between the electronic assembly and the fine metal L/S RDL-substrate and encapsulating the third solder balls.

4. The package structure according to claim 1, wherein the heat dissipation assembly comprises:
   a first thermal interface material, disposed on the application specific integrated circuit assembly;
   a second thermal interface material, disposed on the electronic integrated circuit assembly; and
   a heat dissipator, disposed on the application specific integrated circuit assembly and the electronic integrated circuit assembly, wherein the first thermal interface material is located between the heat dissipator and the application specific integrated circuit assembly, and the second thermal interface material is located between the heat dissipator and the electronic integrated circuit assembly.

5. The package structure according to claim 1, wherein the heat dissipation assembly comprises:
   a plurality of thermoelectric coolers, respectively disposed on the application specific integrated circuit assembly, the electronic integrated circuit assembly, and the photonic integrated circuit assembly; and
   a plurality of heat dissipators, respectively disposed on the thermoelectric coolers, wherein the thermoelectric coolers are located between the heat dissipators and the application specific integrated circuit assembly, the electronic integrated circuit assembly, and the photonic integrated circuit assembly, respectively.

6. The package structure according to claim 5, wherein the heat dissipation assembly comprises:
   a plurality of first thermal interface materials, respectively disposed between the thermoelectric coolers and the application specific integrated circuit assembly, the electronic integrated circuit assembly, and the photonic integrated circuit assembly; and
   a plurality of second thermal interface materials, respectively disposed between the heat dissipators and the thermoelectric coolers.

7. The package structure according to claim 1, wherein the photonic integrated circuit assembly further comprises a photodiode, and the electronic integrated circuit assembly comprises a transimpedance amplifier and a driver chip.

8. The package structure according to claim 7, wherein the optical fiber assembly comprises an optical fiber connector, a first fiber coupler, a second fiber coupler, a first optical fiber cable, and a second optical fiber cable, the optical fiber connector is disposed on and electrically connected to the package substrate, the first optical fiber cable passes through the optical fiber connector and is electrically connected to the photodiode by the first fiber coupler, and the second optical fiber cable passes through the optical fiber connector and is electrically connected to the optical signal transmitter by the second fiber coupler.

9. The package structure according to claim 8, wherein an optical signal enters the photodiode from the first optical fiber cable, the photodiode converts the optical signal into an electric signal, amplifies the electric signal by the transimpedance amplifier, and transmits the amplified electric signal to the application specific integrated circuit assembly, and the application specific integrated circuit assembly transmits the electric signal to the optical signal transmitter by the driver chip to convert the electric signal into another optical signal and emits the optical signal outward to the second optical fiber cable to transmit the optical signal to an external circuit.

\* \* \* \* \*